(12) United States Patent
Rodriguez et al.

(10) Patent No.: US 8,581,600 B2
(45) Date of Patent: Nov. 12, 2013

(54) ELECTRICAL CONNECTIVITY TEST APPARATUS AND METHODS

(75) Inventors: Jose Miguel Rodriguez, San Diego, CA (US); Matthew James West, Salem, OR (US); Cesar Fernandez Espasa, San Diego, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 400 days.

(21) Appl. No.: 12/967,744

(22) Filed: Dec. 14, 2010

(65) Prior Publication Data

US 2012/0151289 A1 Jun. 14, 2012

(51) Int. Cl.
*G01R 31/02* (2006.01)
*H04B 3/46* (2006.01)

(52) U.S. Cl.
USPC ............................................. 324/539; 375/224

(58) Field of Classification Search
USPC .......................................................... 324/539
See application file for complete search history.

(56) References Cited

U.S. PATENT DOCUMENTS

| | | | |
|---|---|---|---|
| 5,777,487 A | 7/1998 | Burgess | |
| 6,201,383 B1 * | 3/2001 | Lo et al. | 324/73.1 |
| 6,640,272 B1 * | 10/2003 | Hartwell et al. | 710/104 |
| 7,420,375 B2 * | 9/2008 | Gohel | 324/539 |
| 2001/0036227 A1 * | 11/2001 | Matsuo et al. | 375/224 |
| 2002/0087924 A1 * | 7/2002 | Panis et al. | 714/712 |
| 2003/0131297 A1 * | 7/2003 | Fischel et al. | 714/728 |
| 2009/0001995 A1 | 1/2009 | Satoh et al. | |
| 2009/0085953 A1 | 4/2009 | Ito | |
| 2009/0182523 A1 * | 7/2009 | Nakano et al. | 702/120 |

FOREIGN PATENT DOCUMENTS

| | | | | |
|---|---|---|---|---|
| EP | 1013426 | 6/2000 | | |
| GB | 752151 | 7/1956 | | |
| JP | PCT/JP2006/321724 | * 5/2008 | ............ | G01R 31/02 |
| JP | 2009105400 | 5/2009 | | |
| KR | 100888580 | 3/2009 | | |

* cited by examiner

*Primary Examiner* — Jeff Natalini

(57) ABSTRACT

Methods and apparatus are provided related to testing electrical connectivity. A sequence of distinct test data signal patterns is issued. The test data signals are propagated by way of respective pathways and electrical connectors. A feedback signal is generated in accordance with a test function for each of the test data signal patterns. A test results message is generated in accordance with the feedback signals, which can include specific diagnostic or identifying information.

16 Claims, 4 Drawing Sheets

| T0 | T1 | T2 | ... | Tn-1 | EXPECTED Vcn | |
|---|---|---|---|---|---|---|
| 1 | 1 | 1 | ... | 1 | $V_h$ | — 302 |
| 0 | 1 | 1 | ... | 1 | $(n-1)*(V_h-V_l)/n + V_l$ | — 304 |
| 1 | 0 | 1 | ... | 1 | $(n-1)*(V_h-V_l)/n + V_l$ | — 306 |
| 1 | 1 | 0 | ... | 1 | $(n-1)*(V_h-V_l)/n + V_l$ | — 308 |
| ⋮ | ⋮ | ⋮ | ⋮ | ⋮ | ⋮ | |
| 1 | 1 | 1 | ... | 0 | $(n-1)*(V_h-V_l)/n + V_l$ | — 310 |

$F_{test} = [T0 + T1 + T2 + ... + Tn-1]*(V_h-V_l)/n + V_l \pm V_{tol}$ — 312

ELECTRICAL CONNECTIVITY TEST APPARATUS AND METHODS

BACKGROUND

A multitude of different systems and devices operate by way of electronic data, control and other signals. Different forms of electrical connectors, cabling assemblies and the like are used to couple signals between entities within a system. Various machines such as printing apparatus, industrial process equipment and others rely on signal propagation integrity for normal operation.

However, an open, short or other electrical fault condition within even one signal propagation pathway can disrupt the proper operation of an entire machine or system. Detection of such a fault expedites troubleshooting and repair, and helps to prevent or reduce system damage due to improper operation. The present teachings address the foregoing and other concerns.

BRIEF DESCRIPTION OF THE DRAWINGS

The present embodiments will now be described, by way of example, with reference to the accompanying drawings, in which.

DETAILED DESCRIPTION

Introduction

Methods and apparatus are provided related to testing electrical connectivity in apparatus, devices and systems. A sequence of distinct test data signal patterns is issued by a controller. The test data signals are propagated by way of respective pathways, data transmitters and receivers, and electrical connectors. A feedback signal is generated in accordance with a test function for each of the test data signal patterns. A test results message is generated in accordance with the feedback signals. The test results message can include specific diagnostic, electrical fault type or other helpful information.

In one embodiment, an apparatus includes a plurality of drivers, each configured to transmit data by way of a low voltage differential signal. The apparatus also includes a plurality of receivers, each configured to receive a respective one of the low-voltage differential signals and to provide a corresponding single-ended output signal. The plurality of receivers is coupled to the plurality of drivers by way of an electrical connector. The apparatus also includes circuitry configured to provide a feedback signal by way of an electrical pathway. The feedback signal corresponds to a test function of the plurality of single-ended output signals. The apparatus further includes a controller configured to issue a connectivity test result message in accordance with the feedback signal.

In another embodiment, an electronic circuit is configured to respectively assert a plurality of test data signals so as to define a unique pattern for each step of a test sequence. The electronic circuit is also configured to receive a respective feedback signal for each step in the test sequence. The electronic circuit is further configured to provide a connectivity test result message in accordance with the feedback signals. The electronic circuit is additionally configured to evaluate the feedback signals in accordance with a tolerance.

In still another embodiment, a method includes the step of issuing a sequence of unique test patterns within an electronic circuit. Each of the test patterns is defined by a plurality of test data signals simultaneously asserted at respective logic levels. The method also includes the step of propagating the test patterns through a plurality of drivers to a plurality of receivers by way of an electrical connector. The method also includes generating a serial data feedback signal for each of the test patterns in accordance with a test function, and evaluating each of the feedback signals. The method further includes the step of providing a test results message in accordance with the evaluating.

First Illustrative Circuitry

Figure 1:
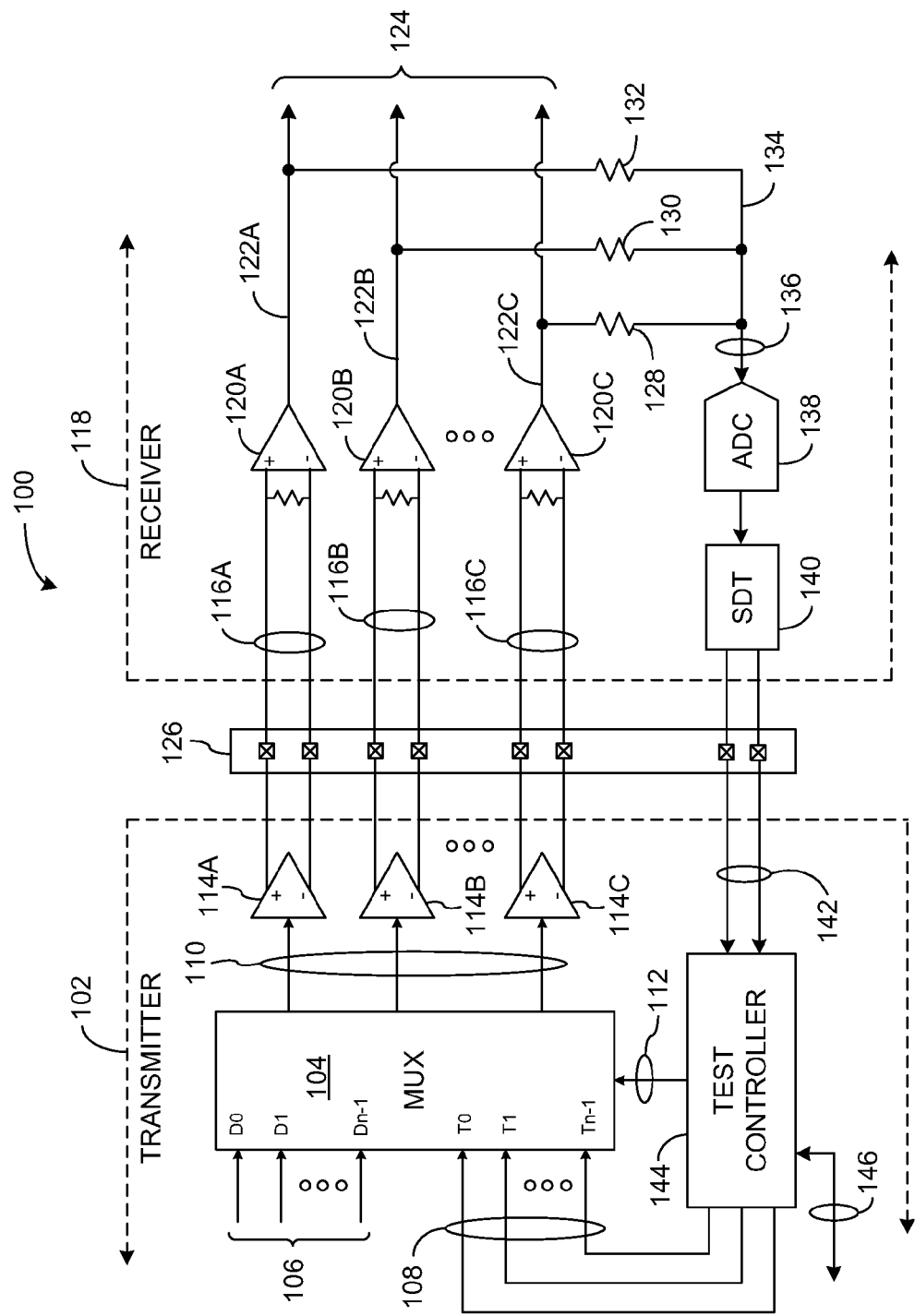
FIG. 1 is schematic view depicting electronic circuitry according to one example.

Reference is now directed to FIG. 1, which depicts a schematic view of electronic circuitry 100. The circuitry 100 is illustrative and non-limiting with respect to the present teachings. Thus, other circuits, apparatuses, devices or systems can be configured and operated in accordance with the present teachings.

The circuitry 100 includes transmitter portion 102. The transmitter portion 102 includes a multiplexer 104. The multiplexer 104 is configured to receive respective data signals by way of a plurality of data input lines 106. The multiplexer 104 is also configured to receive respective test data signals by way of a plurality of test data input lines 108. In one example, the number of data input lines 106 is equal to the number of test data input lines 108. The multiplexer 104 is further configured to couple either the data input lines 106 or the test data input lines 108 to a corresponding plurality of output lines 110 in accordance with the logic level or state of a mode select signal 112.

The transmitter portion 102 also includes a plurality of drivers 114A, 114B and 114C, respectively. Each of the drivers 114A-114C is configured to receive an input signal from a respective one of the output lines 110. Each driver 114A-114C is also configured to provide a low-voltage differential signal 116A, 116B and 116C, respectively, in accordance with an instantaneous signal or logic-level state present on the corresponding output line 110 coupled thereto.

The circuitry 100 also includes a receiver portion 118. The receiver portion 118 includes a plurality of receivers 120A through 120C. Each receiver 120A-120C is coupled to receive a respective one of the low-voltage differential signals 116A-116C and to provide a corresponding single-ended output signal 122A-122C, respectively. The single-ended output signals 122A-122C collectively define an output signal set 124. The output signal set 124 can be coupled to other receiving entities, circuits, electronic devices, and so on. The specific application (e.g., image printing, data storage, industrial control, etc.) of the output signal set 124 is not germane to the present teachings.

The circuitry 100 depicts a total of three drivers 114A-114C coupled in one-to-one correspondence to three receivers 120A-120C in the interest of clarity. However, it is to be understood that the present teachings contemplate the use of any practical number of drivers and receivers in accordance with a total number of data signals to be propagated there through. Thus, respective circuits having four, sixteen, sixtyfour, etc., discrete data signals, as well as the corresponding number of drivers, receivers, pathways and so on, are contemplated.

The low-voltage differential signals 116A-116C are coupled to the respective receivers 120A-120O by way of an electrical connector 126. The electrical connector 126 can be defined by any suitable connector known to one of ordinary skill in the electrical and related arts. In one example, the electrical connector 126 is configured to selectively couple and uncouple a plurality of respective electrical pathways or conductors.

The receiver portion 118 also includes a plurality of resistors 128, 130 and 132, respectively. Each of the resistors 128-132 is electrically coupled to (i.e., between) a common node 134 and a respective one of the single-ended output signals 122A, 122B and 122C. The resistors 128-132 collectively define a voltage averaging network such that an analog voltage 136 is provided at the common node 134 in accordance with the following:

$$Vcn=(n-1)*(Vh-Vl)/n+Vl \qquad \text{(Equation 1)}$$

Where:
Vcn=voltage at common node;
n=number of single-ended output signals;
Vh=voltage of greater logic level; and
Vl=voltage of lesser logic level.

Equation 1 above is also referred to herein as a "test function" and will be described in further detail hereinafter.

The receiver portion 118 also includes an analog-to-digital converter (AOC) 138. The ADC 138 is configured to sense or receive the analog voltage 136 present at the common node 134 and to provide a corresponding digitally quantified output. Also included is a serial data transmitter (SDT) 140. The SDT 140 is coupled to receive the digital output from the ADC 138 and to provide a corresponding serial data signal 142. In one example, the SOT 140 receives a parallel data signal from the ADC 138, and provides a corresponding serial data signal 142. As depicted, the serial data signal 142 is propagated by way of data and clock signals, respectively, over a pair of conductors or pathways. In another example, a single data pathway or conductor is used to propagate the signal 142 away from the SOT 140. The serial data signal 142 is also referred to herein as a feedback signal and is routed through the electrical connector 126.

The transmitter portion 102 of the circuitry 100 further includes a test controller 144. The test controller 144 is configured to receive the serial data signal 142 such that digital feedback correspondent to the voltage 136 (i.e., test function) is defined. The test controller 144 is also configured to assert the mode select signal 112 in either a first state or a second state depending upon operating mode. The test controller 144 is also configured to provide or assert each of the test data input lines (signals) 108. The test controller 144 is further configured to receive commands and to provide messages and information by way of bidirectional signaling 146.

The test controller 144 can be defined by any suitable electronic constituency. In one example, the test controller 144 is defined by an application-specific integrated circuit (ASIC). In another example, the test controller 144 is defined by or includes a microprocessor or microcontroller operating in accordance with an executable program code. In yet another example, the test controller 144 is defined by a state machine. Other forms of test controller 144 can also be used. Normal operations of the circuitry 100 are described hereinafter.

First Illustrative Method

Figure 2:
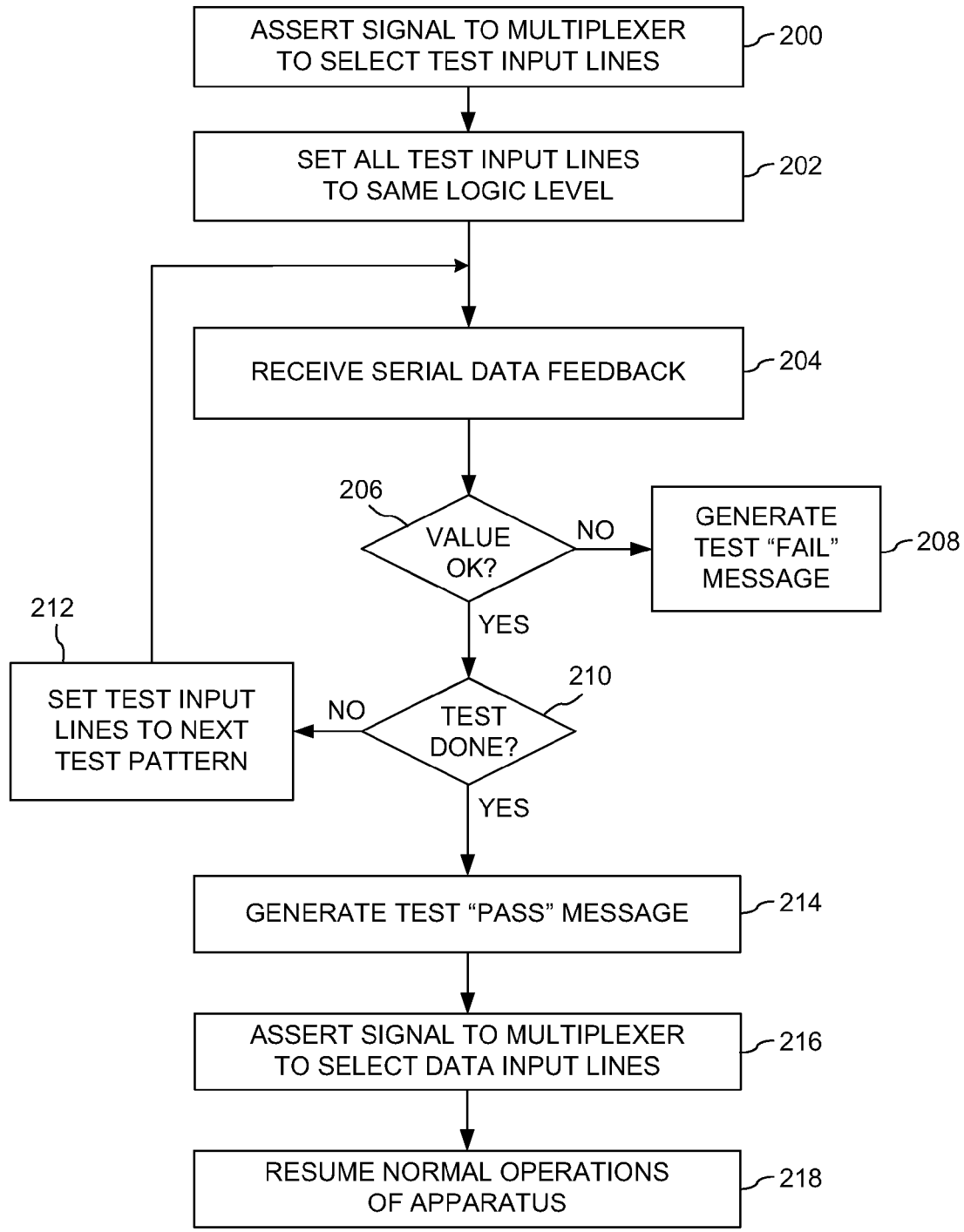
FIG. 2 is a flow diagram depicting a connectivity test sequence method according to another example.

Attention is now directed to FIG. 2, which depicts a flow diagram of a connectivity test method according to one example of the present teachings. The method of FIG. 2 includes particular operations and order of execution. However, other methods including other operations, omitting one or more of the depicted operations, or proceeding in other orders of execution can also be used according to the present teachings. Thus, the method of FIG. 2 is illustrative and non-limiting in nature. Reference is also made to FIG. 1 in the interest of understanding the method of FIG. 2.

At 200, a mode select signal to a multiplexer is asserted so as to select test data input lines. For purposes of illustration, it is assumed that the test controller 144 asserts the signal 112 in a first state corresponding to a connectivity test mode. The assertion of the signal 112 in the first state causes the multiplexer 104 to couple the test data input lines 108 in one-to-one correspondence to the output lines 110.

At 202, all test data input lines are set to a same, first logic level. For purposes of the present illustration, the test controller 144 asserts all of the test data input lines 108 at a first logic level "1". This test data input condition defines a first pattern corresponding to a first step in a test sequence. The first pattern is provided to the drivers 114A-114C, which transmit corresponding low-voltage differential signals 116A-116C to the respective receivers 120A-120C. The single-ended output signals 122A-122C result in a corresponding analog voltage 136 at the common node 134.

At 204, serial data feedback is received at the test controller. For purposes of the present illustration, the ADO 138 provides a digital quantification of the analog voltage 136 to the SDT 140. The SDT 140 provides a corresponding serial data signal 142 to the test controller 144. This serial data signal 142 provides feedback regarding the voltage 136 at the common node 134 in accordance with the test function (i.e., Equation 1).

At 206, the value of the feedback is evaluated for validity. In the present illustration, the test controller 144 checks the feedback signal 142 value, in accordance with a tolerance range, against an expected value for the present pattern in the test sequence. If the value is valid according to the check, the method proceeds to step 210 below. If the value is invalid according to the check, the method proceeds to step 208 below.

At 208, a test fail message is generated. For purposes of the present illustration, the test controller 144 generates a "connectivity test FAIL" message and provides that message as data by way of signaling 146. Optionally, the message can include specific diagnostic information identifying an electrical connector (e.g., 126), a low-voltage differential signal line (e.g., 116A, 116B or 116C) where an electrical fault is detected, or the nature of a fault itself (e.g., short circuit, open circuit, etc.). The present instance of the method of FIG. 2 is now ended.

At 210, it is determined if the present test sequence is complete. For purposes of the present illustration, the test controller 144 determines if all of the test data signal patterns of the test sequence have been issued. If the test sequence is complete, the method proceeds to step 214 below. If the test sequence is not complete, the method proceeds to step 212 below.

At 212, the test data input lines are set to the next test pattern in the test sequence. For purposes of the present illustration, the test controller 144 respectively asserts the test data input lines 108 to the next logic level pattern in the test sequence. In all but the first test pattern, one of the test data input lines is set to logic level "0", while all of the other test data input lines are set to (or remain at) logic level "1". One exemplary test pattern sequence is described in further detail hereinafter. Other test pattern sequences can also be used. The method then returns to step 204 above.

At 214, a test pass message is generated. For purposes of the present illustration, the test controller 144 generates a "connectivity test PASS" message and provides that message as data by way of signaling 146.

At 216, a mode select signal to the multiplexer is asserted so as to select the data input lines. For purposes of the present illustration, it is assumed that the test controller 144 asserts the signal 112 in a second state corresponding to a normal operating mode. The assertion of the signal 112 in the second state causes the multiplexer 104 to couple the data input lines 106 in one-to-one correspondence to the output lines 110.

At 218, normal operations of an apparatus are resumed. For purposes of the present illustration, it is assumed that the method of FIG. 2 was performed within a printing apparatus. Such apparatus is returned to normal operations using data signals propagated by way of the drivers 114A-114C, the electrical connector 126, the receivers 120A-120C, and so on. The connectivity test sequence illustrated by FIG. 2 is now complete for one operational scenario, First Illustrative Test Function Attention is now directed to FIG. 3, which depicts a table 300 including details of a test pattern sequence according to one example of the present teachings. The table 300 is illustrative and non-limiting in nature. The present teachings contemplate any number of test sequences defined by respectively varying test data signal patterns or orders of issuance.

The table 300 includes a row 302. The row 302 includes a plurality of test data logic levels corresponding to a first test pattern. Specifically, the first test pattern includes test data signals $T_0$ through $T_{n-1}$, inclusive, all asserted to a logic level "1". Also, the row 302 includes the expected voltage level 136 at a common node 134 as being equal to Vh. Vh is a higher voltage level used within a binary logic system represented by two nominal voltage levels, Vh and Vl, respectively. In one example, Vh is about five-point-zero volts and Vl is about zero volts. Other logic systems defined by other voltage level pairs can also be used.

The table 300 also includes a row 304. The row 304 corresponds to a second test pattern, wherein the test data signal $T_0$ is asserted to a logic level "0". Also in the second test pattern, all the other test data signals $T_1$ through $T_{n-1}$, inclusive, are asserted (or maintained) at the logic level "1". The row 304 includes the expected voltage level 136 as being equal to: $(n-1)*(Vh-Vl)/n+Vl$. In one illustrative and non-limiting embodiment, n=eight, Vh=five volts, Vl=zero volts, and the expected voltage 136 is; four-point-three-seven-five volts. Other expected voltages can also be used.

The table 300 also includes a row 306 corresponding to a third test pattern. The third test pattern is characterized by a test data signal $T_1$ asserted to the logic level "0", while all other test data signals $T_0$ and $T_2$ through $T_{n-1}$, inclusive, are asserted at the logic level "1". The row 306 includes an expected voltage level 136 equal to; $(n-1)*(Vh-Vl)/n+Vl$.

The table 300 also includes a row 308 corresponding to a fourth test pattern characterized by a test data signal $T_2$ asserted to the logic level "0", while all the other test data signals $T_0$-$T_1$ through $T_{n-1}$, inclusive, are asserted at the logic level "1". The row 308 also includes an expected voltage level 136 equal to; $(n-1)*(Vh-Vl)/n+Vl$.

The test sequence of the table 300 progresses in accordance with the pattern outlined above. Thus, a row 310 corresponding to a final test pattern characterized by a test data signal $T_{n-1}$ asserted to the logic level "0", while all the other test data signals $T_0$ through $T_{n-2}$, inclusive, are asserted at the logic level "1". The row 308 includes an expected voltage level 136 of: $(n-1)*(Vh-Vl)/n+Vl$.

The table 300 further includes a final row 312 including a test function "Ftest" summarizing rows 302-310 above. In particular, the test function is:

$$Ftest=[T_0+T_1+T_2\ldots T_{n-1}]*(Vh-Vl)/n+Vl\pm Vtol \qquad \text{(Equation 2)}$$

Where:
Ftest=expected voltage at the common node;
$T_x$=logic value "1" or "0" for each of n test data signals
Vh=voltage of greater logic level;
Vl=voltage of lesser logic level; and
Vtol=tolerance window about the expected voltage.

The test function "Ftest" is a closed-form expression of the voltage-based logic of the test patterns of the table 300. As such, the present teachings contemplate a test pattern sequence wherein the total number of distinct and unique test patterns is one greater than the total number of test data signals used.

First Illustrative Apparatus

Figures 3, 4:
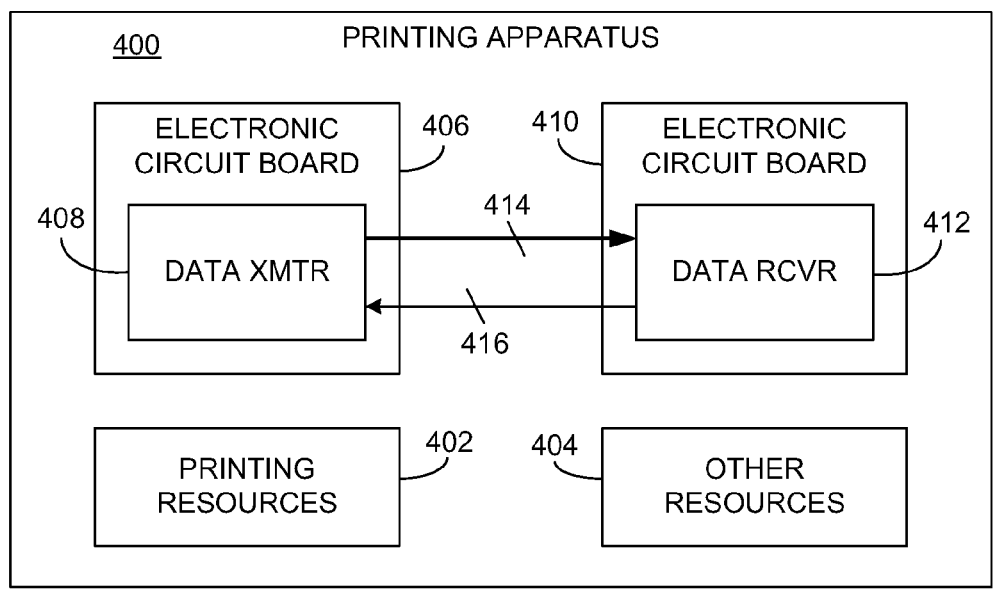
FIG. 3 is a table depicting a test pattern sequence according to another example.
FIG. 4 is a block diagram depicting a printing apparatus according to one example.

Attention is now directed to FIG. 4, which depicts a block diagram of a printing apparatus 400 in accordance with the present teachings. The printing apparatus 400 is configured to form images on media. The printing apparatus 400 is illustrative and non-limiting in nature. Any number of other apparatus, devices and systems—printing or otherwise—are contemplated in accordance with the present teachings.

The apparatus 400 includes printing resources 402. The printing resources 402 can include or be defined by any suitable electrical, electronic or mechanical constituents cooperative to form images on media. Non-limiting examples of such constituents include sheet media transport and handling mechanisms, ink jetting devices, toner deposition devices, dye deposition or applications mechanisms, web press printing assemblies, and so on. The specific identity and configuration of the various elements of the printing resources 402 is not germane to an understanding of the present teachings.

The printing apparatus 400 also includes other resources 404. Other esources 404 can include or be defined by any suitable elements as desired or required for normal operations of the printing apparatus 400. Non-limiting examples of such elements include power supplies, one or more operator interfaces, transport or mechanism drive motors, network communications circuitry, data storage devices, and so on. The specific elements of the other resources 402 are not germane to an understanding of the present teachings.

The printing apparatus 400 also includes an electronic circuit board 406. The electronic circuit board 406 can include any number of electronic devices and elements in any suitable configuration. Such devices can include one or more microprocessors or microcontrollers, data storage devices, state machines, and so on. The electronic circuit board 406 includes a data transmitter 408. The data transmitter 408 includes circuitry configured to transmit data by way of electronic signaling. The data transmitter 408 also includes electrical connectivity testing circuitry in accordance with the present teaching. In one example, the data transmitter 408 is at least partially defined by the transmitter portion 102. Other configurations consistent with the present teachings can also be used.

The printing apparatus 400 further includes an electronic circuit board 410. The electronic circuit board 410 can include any electronic devices and elements in any suitable configuration. Such devices can include one or more microprocessors or microcontrollers, data storage devices, state machines, and so on. The electronic circuit board 410 includes a data receiver 412. The data receiver 412 includes circuitry configured to receive data by way of electronic signaling. The data receiver 410 also includes electrical connectivity testing circuitry in accordance with the present teaching. In one example, the data receiver 412 is at least partially defined by the receiver portion 118. Other configurations consistent with the present teachings can also be used.

The data transmitter 408 is coupled to provide data to the data receiver 412 by way of a plurality of data signals 414. The data signals 414 can be variously defined and formatted. In one example, the data signals 414 are provided by way of a plurality of respective low-voltage differential signal lines or pathways. The data receiver 412 is also coupled to provide an electrical connectivity feedback signal 416 to the data transmitter 408. The feedback signal 416 can be variously defined and formatted. In one example, the feedback signal 416 is provided by a serial data transmission.

It is to be understood that the electronic circuit board 406 and the electronic circuit board 410 can be respectively coupled to the printing resources 402 and the other resources 404. Such specific couplings are not germane to the present teachings and are omitted in FIG. 4 in the interest of clarity.

In general, and without limitation, the printing apparatus 400 operates normally as follows: during a start-up process, the printing apparatus 400 is understood to be preparing to print images on media. A connectivity test is automatically performed by way of cooperation between the data transmitter 408 and the data receiver 412.

A sequence of test data patterns is transmitted from the data transmitter 408 to the data receiver 412 by way of the data signals 414. The data receiver 412 provides feedback information to the data transmitter 408 by way of feedback signals 416. Such feedback information includes a test function result for each of the respective test data patterns in the sequence. In turn, circuitry (e.g., a test controller 144) of the data transmitter 408 interprets each respective feedback signal 416.

The data transmitter 408 then issues a "PASS" or "FAIL" message in accordance with the feedback interpretation. Such a message can include specific fault type information, identity of a particular signal pathway involved in the fault, and so on. Normal startup and printing operations of the printing apparatus 400 can then proceed or be hafted accordingly. Corrective actions can be taken in the event a "FAIL" message is provided.

Second Illustrative Method

Figure 5:
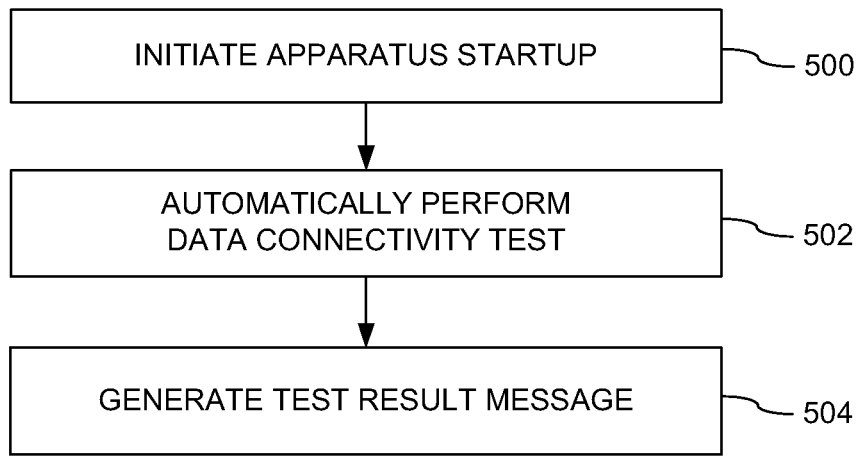
FIG. 5 is a flow diagram depicting a connectivity test method according to one example.

Attention is now directed to FIG. 5, which depicts a flow diagram of a connectivity test method according to one example of the present teachings. The method of FIG. 5 includes particular operations and order of execution. However, other methods including other operations, omitting one or more of the depicted operations, or proceeding in other orders of execution can also be used according to the present teachings. Thus, the method of FIG. 5 is illustrative and nonlimiting in nature. Reference is also made to FIGS. 1, 2 and 4 in the interest of understanding the method of FIG. 5.

At 500, apparatus startup is initiated. For purposes of illustration, it is assumed that a printing apparatus 400 receives signaling or user input prompting an automated startup sequence.

At 502, a data connectivity test is automatically performed. For purposes of the present illustration, a test controller 144 receives signaling 146 prompting a test sequence. In response, a connectivity test sequence is performed under the control of the test controller 144. Such a connectivity test sequence can be performed in accordance with the flow diagram of FIG. 2. Other connectivity test sequences according to the present teachings can also be performed. Test data signals (i.e., 414) and corresponding feedback (i.e., 416) are communicated between the data transmitter 408 and the data receiver 412 in accordance with the test sequence.

At 504, a test result message is generated. For purposes of the present illustration, it is understood that no connectivity faults were detected during the test performed at 502 above. Accordingly, the test controller 144 issues a test "PASS" message by way of signaling 146. Other normal startup or printing operations of the printing apparatus 400 can then be performed.

Third Illustrative Method

Figure 6:
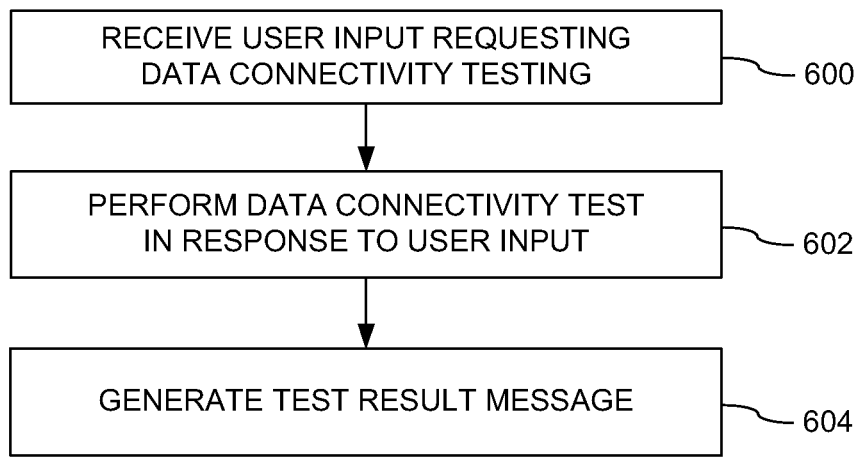
FIG. 6 is a flow diagram depicting a connectivity test method according to another example.

Attention is now directed to FIG. 6, which depicts a flow diagram of a connectivity test method according to one example of the present teachings. The method of FIG. 6 includes particular operations and order of execution. However, other methods including other operations, omitting one or more of the depicted operations, or proceeding in other orders of execution can also be used according to the present teachings. Thus, the method of FIG. 6 is illustrative and non-limiting in nature. Reference is also made to FIGS. 1, 2 and 4 in the interest of understanding the method of FIG. 6.

At 600, a user input is received requesting a data connectivity test. For purposes of illustration, it is assumed that a printing apparatus 400 receives a user input prompting an automated connectivity test sequence by way of a user interface (e.g., other resources 404). A corresponding signal 146 is then provided to test controller 144 so as to initiate the connectivity test. Normal printing operations of the printing apparatus 400 are suspended for purposes of the connectivity test.

At 602, a data connectivity test is automatically performed. For purposes of the present illustration, the test controller 144 performs a connectivity test sequence. Such a connectivity test can be performed in accordance with the flow diagram of FIG. 2. Other connectivity test sequences according to the present teachings can also be performed. Test data signals and corresponding feedback are communicated between the data transmitter 408 and the data receiver 412 accordingly.

At 604, a test result message is generated. For purposes of the present illustration, it is understood that no connectivity faults were detected during the test performed at 502 above. Accordingly, the test controller 144 issues a test "PASS" message by way of signaling 146. Other normal operations of the printing apparatus 400 can then be performed or continued.

In general, the foregoing description is intended to be illustrative and not restrictive. Many embodiments and applications other than the examples provided would be apparent to those of ordinary skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus, comprising:
 a plurality of drivers each configured to transmit data by way of a low-voltage differential signal;
 a plurality of receivers each configured to receive a respective one of the low-voltage differential signals and to provide a corresponding single-ended output signal, the plurality of receivers coupled to the plurality of drivers by way of an electrical connector;

circuitry configured to provide a feedback signal by way of an electrical pathway, the feedback signal corresponding to a voltage averaging test function of the plurality of single-ended output signals, the voltage averaging test function combining non-zero voltage output signals provided simultaneously by at least two of the plurality of receivers; and a controller configured to issue a connectivity test result in accordance with an expected value of the voltage averaging test function of the feedback signal.

2. The apparatus according to claim 1, the circuitry including:

a plurality of resistors each coupled to a common node and to a respective one of the single-ended output signals;

an analog-to-digital converter configured to provide a digital signal corresponding to an analog voltage present at the common node; and circuitry configured to transmit a serial data representation of the digital signal thus defining the feedback signal.

3. The apparatus according to claim 1, the controller further configured to:

assert a test signal at a first logic level during a connectivity test sequence;

assert a plurality of test data signals in accordance with the connectivity test sequence, each of the test data signals formatted to be input to a respective one of the drivers, the connectivity test sequence defined by a plurality of distinct test data patterns; and assert the test signal at a second logic level outside of the test sequence.

4. The apparatus according to claim 3, the test signal formatted to be input to a mode selector of a multiplexer.

5. The apparatus according to claim 1 further comprising a multiplexer configured to couple the plurality of drivers to respective ones of:

a plurality of data signals during a normal operating mode; and a plurality of test data signals provided by the controller during a test sequence operating mode.

6. The apparatus according to claim 1, the circuitry further configured such that the voltage test function is in accordance with:

$$Vcn=(n-1)*(Vh-Vl)/n+Vl\pm Vtol;$$

where:
Vcn=voltage of the feedback signal at a common node;
n=number of the plurality of drivers;
Vh=greater logic level voltage;
Vl=lesser logic level voltage; and
Vtol=tolerance window about an expected voltage.

7. The apparatus according to claim 1, the circuitry configured such that the feedback signal includes a serial data signal and a clock signal.

8. An electronic circuit configured to:

respectively assert a plurality of test data signals simultaneously to a plurality of receivers so as to define a unique pattern for each step of a test sequence;

receive a respective voltage averaged feedback signal from the plurality of receivers for each step in the test sequence, the voltage averaged feedback signal combining non-zero voltage output signals provided simultaneously by at least two of the plurality of receivers; and provide a connectivity test result message in accordance with an expected value of the voltage averaged feedback signals, the electronic circuit configured to evaluate the expected value of the voltage averaged feedback signals in accordance with a tolerance.

9. The electronic circuit according to claim 8, further configured to:

assert a mode signal in a first logic state during the test sequence, the mode signal formatted to be input to a multiplexer; and assert the mode signal in a second logic state outside of the test sequence.

10. The electronic circuit according to claim 8, further configured such that:

all of the test data signals are asserted to a first logic level during one step of the test sequence; and one of the test data signals is asserted to a second logic level while all of the other test data signals are asserted to the first logic level during each of the other steps of the test sequence.

11. The electronic circuit according to claim 8, the electronic circuit being part of a printing apparatus.

12. The electronic circuit according to claim 8, the electronic circuit at least partially defined by an integrated circuit device.

13. The electronic circuit according to claim 8, further configured such that a total number of steps in the test sequence is one greater than a total number of the test data signals.

14. A method, comprising:

issuing a sequence of unique test patterns within an electronic circuit, each test pattern defined by a plurality of test data signals simultaneously asserted at respective logic levels;

propagating the test patterns simultaneously through a plurality of drivers to a plurality of receivers by way of at least one electrical connector;

generating a serial data feedback signal for each of the test patterns in accordance with a voltage averaging test function, the voltage averaging test function combining non-zero voltage output signals provided simultaneously by at least two of the plurality of receivers;

evaluating an expected value of the voltage averaging test function for each of the feedback signals; and providing a test results message in accordance with the evaluating.

15. The method according to claim 14, the voltage averaging test function performed in accordance with:

$$Vcn=(n-1)*(Vh-Vl)/n+Vl;$$

where:
Vcn=voltage of the feedback signals at a common node;
n=number of the test data signals;
Vh=greater logic level voltage; and
Vl=lesser logic level voltage.

16. The method according to claim 14, each of the drivers configured to receive a respective one of the test data signals and to transmit a corresponding low-voltage differential signal, each of the receivers configured to receive a respective one of the low-voltage differential signals and to provide a corresponding single-ended output signal.

* * * * *

UNITED STATES PATENT AND TRADEMARK OFFICE
CERTIFICATE OF CORRECTION

PATENT NO. : 8,581,600 B2
APPLICATION NO. : 12/967744
DATED : November 12, 2013
INVENTOR(S) : Jose Miguel Rodriguez et al.

It is certified that error appears in the above-identified patent and that said Letters Patent is hereby corrected as shown below:

In the Specification:

In column 9, line 10, in Claim 1, delete "result" and insert -- result message --, therefor.

In column 9, line 43, in Claim 6, delete "voltage" and insert -- voltage averaging --, therefor.

In column 9, line 45, in Claim 6, delete "Vcn=(n-1)*( Vh-·Vl)/n+Vl±Vtol;" and insert -- Vcn=(n-1)*(Vh-Vl)/n+Vl±Vtol; --, therefor.

In column 10, line 51, in Claim 15, delete "Vcn=(n-l)*(Vh-Vl)/n+Vl;" and insert -- Vcn=(n-l)*(Vh-Vl)/n+Vl; --, therefor.

Signed and Sealed this
Fourth Day of March, 2014

Michelle K. Lee
*Deputy Director of the United States Patent and Trademark Office*